(12) United States Patent
Tsai et al.

(10) Patent No.: US 12,717,238 B2
(45) **Date of Patent: *Aug. 25, 2026**

(54) METHOD AND APPARATUS FOR MITIGATING TIN DEBRIS

(71) Applicant: Taiwan Semiconductor Manufacturing Company, Ltd., Hsinchu (TW)

(72) Inventors: Cheng Hung Tsai, Hsinchu (TW); Sheng-Kang Yu, Hsinchu City (TW); Shang-Chieh Chien, New Taipei City (TW); Heng-Hsin Liu, New Taipei City (TW); Li-Jui Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 48 days.

This patent is subject to a terminal disclaimer.

(21) Appl. No.: 18/761,020

(22) Filed: Jul. 1, 2024

(65) Prior Publication Data

US 2024/0353765 A1 Oct. 24, 2024

Related U.S. Application Data

(63) Continuation of application No. 17/488,131, filed on Sep. 28, 2021, now Pat. No. 12,061,423.

(60) Provisional application No. 63/182,620, filed on Apr. 30, 2021.

(51) Int. Cl.
*G03F 7/00* (2006.01)

(52) U.S. Cl.
CPC ................................ *G03F 7/70033* (2013.01)

(58) Field of Classification Search
CPC ............. G03F 7/70033; G03F 7/70916; G03F 7/2004; H05G 2/0094
USPC ...................................................... 250/504 R
See application file for complete search history.

(56) References Cited

U.S. PATENT DOCUMENTS

| | | | |
|---|---|---|---|
| 10,791,616 B1 | 9/2020 | Chen et al. | |
| 2011/0240890 A1 | 10/2011 | Govindaraju et al. | |
| 2016/0209753 A1* | 7/2016 | Zhao | H05G 2/0094 |
| 2020/0041783 A1* | 2/2020 | Liu | G02B 27/0006 |
| 2020/0057181 A1* | 2/2020 | Yang | G03F 7/70916 |

OTHER PUBLICATIONS

Non-Final Office Action issued in U.S. Appl. No. 17/488,131, dated Dec. 7, 2023.
Notice of Allowance issued in U.S. Appl. No. 17/488,131, dated Apr. 2, 2024.

* cited by examiner

*Primary Examiner* — Kiet T Nguyen
(74) *Attorney, Agent, or Firm* — STUDEBAKER BRACKETT PLLC

(57) ABSTRACT

Microwave heating of debris collecting vanes within the source vessel of a lithography apparatus is used to accomplish uniform temperature distribution in order to reduce fall-on contamination and formation of clogs on the inner and outer surfaces of the vanes.

20 Claims, 12 Drawing Sheets

METHOD AND APPARATUS FOR MITIGATING TIN DEBRIS

CROSS-REFERENCE TO RELATED APPLICATIONS

This application claims priority to U.S. patent application Ser. No. 17/488,131, entitled "METHOD AND APPARATUS FOR MITIGATING TIN DEBRIS" filed on Sep. 28, 2021, which claims priority under 35 U.S.C. 119 (e) to U.S. Provisional Patent Application Ser. No. 63/182,620, entitled "ELIMINATE TIN-VANE CLOGGING WITH MICROWAVE HEATING FOR Sn FALL-ON REDUCTION" filed on Apr. 30, 2021, the entirety of each of which is hereby incorporated by reference.

BACKGROUND

One growing technique for semiconductor manufacturing is extreme ultraviolet (EUV) lithography. EUV lithography employs scanners using light in the EUV spectrum of electromagnetic radiation, including wavelengths from about one nanometer (nm) to about one hundred nm. Many EUV scanners still utilize projection printing, similar to various earlier optical scanners, except EUV scanners accomplish it with reflective rather than refractive optics, that is, with mirrors instead of lenses.

EUV lithography employs a laser-produced plasma (LPP), which emits EUV light. The LPP is produced by focusing a high-power laser beam, from a carbon dioxide ($CO_2$) laser and the like, onto small fuel droplet targets of tin (Sn) in order to transition it into a highly-ionized plasma state. This LPP emits EUV light with a peak maximum emission of about 13.5 nm or smaller. The EUV light is then collected by a collector and reflected by optics towards a lithography exposure object, such as a semiconductor wafer. Tin debris is generated in the process, and may adversely affect the performance and efficiency of the EUV apparatus.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
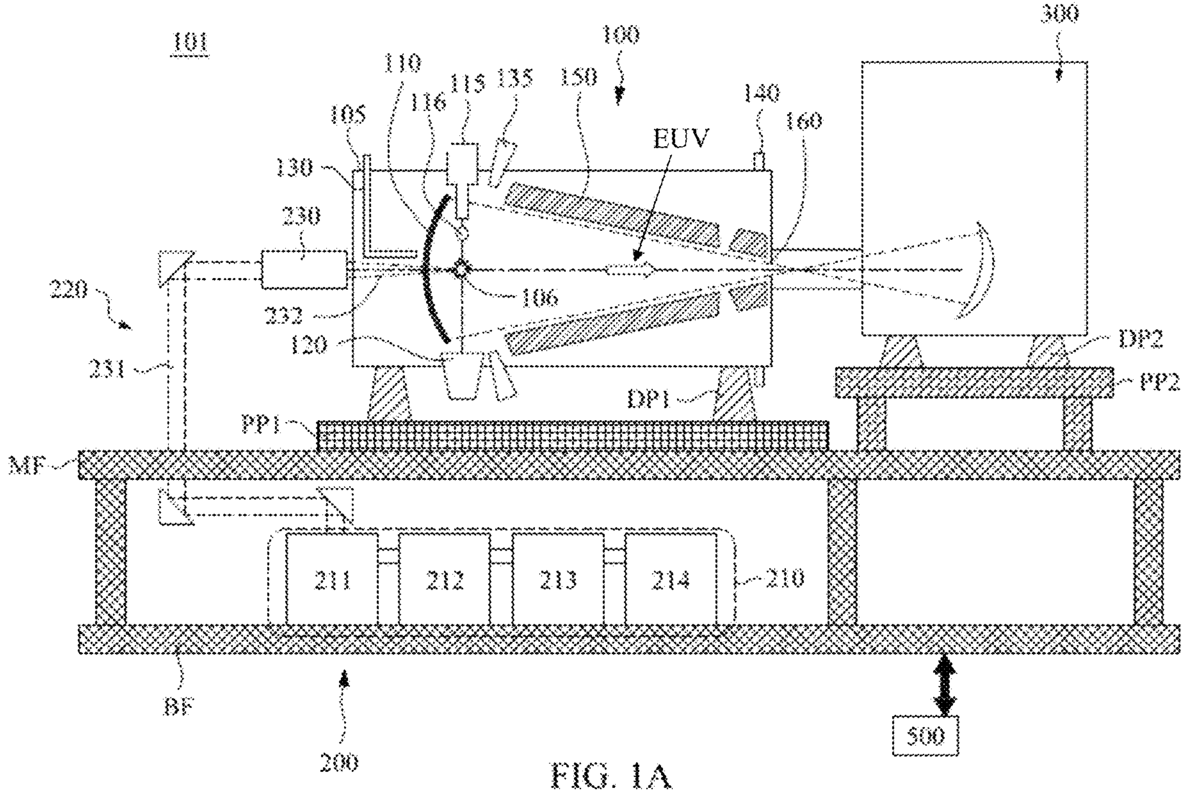
FIG. 1A is a diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the certain embodiments, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In various embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform various lithography exposing processes. The lithography system may further include other modules or be integrated with (or be coupled with) other modules.

A lithography system is essentially a light projection system. Light is projected through a ‘mask’ or ‘reticle’ that constitutes a blueprint of the pattern that will be printed on a workpiece. In many embodiments, the blueprint is four times larger than the intended pattern on the wafer or chip. With the pattern encoded in the light, the system’s optics shrink and focus the pattern onto a silicon wafer coated with a photoresist. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more, laying patterns on top of patterns. The size of the features to be printed varies depending on the layer, which means that different types of lithography systems are used for different layers, from the latest-generation EUV systems for the smallest features to older deep ultraviolet (DUV) systems for the largest.

FIG. 1A is a schematic and diagrammatic view of an EUV lithography system 10. The EUV lithography system 10 includes an EUV radiation source apparatus 100 (sometimes referred to herein as a “source side” in reference to it, or one or more of its relevant parts) to generate EUV light, an exposure tool 300, such as a scanner, and an excitation laser source apparatus 200. As shown in FIG. 1A, in some embodiments, the EUV radiation source apparatus 100 and the exposure tool 300 are installed on a main floor (MF) of a clean room, while the excitation laser source apparatus 200 is installed in a base floor (BF) located under the main floor. Each of the EUV radiation source apparatus 100 and the exposure tool 300 are placed over pedestal plates PP1 and PP2 via dampers DP1 and DP2, respectively. The EUV radiation source apparatus 100 and the exposure tool 300 are coupled to each other by a coupling mechanism, which may include a focusing unit (not shown).

The EUV lithography system 10 is designed to expose a resist layer to EUV light (or EUV radiation). The resist layer is a material sensitive to the EUV light. The EUV lithography system 10 employs the EUV radiation source apparatus 100 to generate EUV light having a wavelength ranging between about 1 nanometer (nm) and about 100 nm. In one particular example, the EUV radiation source apparatus 100 generates EUV light with a wavelength centered at about 13.5 nm. In various embodiments, the EUV radiation source apparatus 100 utilizes LPP to generate the EUV radiation.

As further shown in FIG. 1A, the EUV radiation source apparatus 100 includes a target droplet generator 115 and an LPP collector 110, enclosed by a chamber 105. The target droplet generator 115 generates a plurality of target droplets 116. In some embodiments, the target droplets 116 are tin (Sn) droplets. In some embodiments, the target droplets 116 have a diameter of about 30 microns (μm). In some embodiments, the target droplets 116 are generated at a rate about fifty droplets per second and are introduced into an excitation zone 106 at a speed of about seventy meters per second (m/s or mps). Various other materials can also be used for the target droplets 116, for example, a liquid material such as a eutectic alloy containing Sn and lithium (Li).

As the target droplets 116 move through the excitation zone 106, pre-pulses (not shown) of the laser light first heat the target droplets 116 and transform them into lower-density target plumes. Then, the main pulse 232 of laser light is directed through windows or lenses (not shown) into the excitation zone 106 to transform the target plumes into a LLP. The windows or lenses are composed of a suitable material substantially transparent to the pre-pulses and the main pulse 232 of the laser. The generation of the pre-pulses and the main pulse 232 is synchronized with the generation of the target droplets 116. In various embodiments, the pre-heat laser pulses have a spot size about 100 μm or less, and the main laser pulses have a spot size about 200-300 μm. A delay between the pre-pulse and the main pulse 232 is controlled to allow the target plume to form and to expand to an optimal size and geometry. When the main pulse 232 heats the target plume, a high-temperature LPP is generated. The LPP emits EUV radiation, which is collected by one or more mirrors of the LPP collector 110. More particularly, the LPP collector 110 has a reflection surface that reflects and focuses the EUV radiation used for the lithography exposing processes. In some embodiments, a droplet catcher 120 (sometimes referred to as a debris container) is installed opposite the target droplet generator 115. The droplet catcher 120 is used for catching excess target droplets 116 for example, when one or more target droplets 116 are purposely or otherwise missed by the pre-pulses or main pulse 232.

The LPP collector 110 includes a proper coating material and shape to function as a mirror for EUV collection, reflection, and focusing. In some embodiments, the LPP collector 110 is designed to have an ellipsoidal geometry. In some embodiments, the coating material of the collector 100 is similar to the reflective multilayer of an EUV mask. In some examples, the coating material of the LPP collector 110 includes multiple layers, such as a plurality of molybdenum/silicon (Mo/Si) film pairs, and may further include a capping layer (such as ruthenium (Ru)) coated on the multiple layers to substantially reflect the EUV light.

The main pulse 232 is generated by the excitation laser source apparatus 200. In some embodiments, the excitation laser source apparatus 200 includes a pre-heat laser and a main laser. The pre-heat laser generates the pre-pulse that is used to heat or pre-heat the target droplet 116 in order to create a low-density target plume, which is subsequently heated (or reheated) by the main pulse 232, thereby generating increased emission of EUV light.

The excitation laser source apparatus 200 may include a laser generator 210, laser guide optics 220 and a focusing apparatus 230. In some embodiments, the laser generator 210 includes a carbon dioxide ($CO_2$) laser source or a neodymium-doped yttrium aluminum garnet (Nd:YAG) laser source. The laser light 231 generated by the laser generator 210 is guided by the laser guide optics 220 and focused into the main pulse 232 of the excitation laser by the focusing apparatus 230, and then introduced into the EUV radiation source apparatus 100 through one or more apertures, such as the aforementioned windows or lenses.

Within the EUV radiation source apparatus 100, the LPP generated by the main pulse 232 creates physical debris, such as ions, gases and atoms of the droplet 116, along with the desired EUV light. In various embodiments of the lithography system 10, there is an accumulation of such debris on the LPP collector 110, and such physical debris exits the chamber 105 and enters the exposure tool 300 (scanner side), as well as within the excitation laser source apparatus 200.

In various embodiments, a buffer gas is supplied from a first buffer gas supply 130 through the aperture in the LPP collector 110 by which the main pulse 232 of laser light is delivered to the tin droplets 116. In some embodiments, the buffer gas is hydrogen ($H_2$), helium (He), argon (Ar), nitrogen ($N_2$), or another inert gas. In certain embodiments, $H_2$ is used, since hydrogen radicals generated by ionization of the buffer gas can also be used for cleaning purposes. The buffer gas can also be provided through one or more second buffer gas supplies 135 toward the LPP collector 110 and/or around the edges of the LPP collector 110. In various embodiments, the chamber 105 includes one or more gas outlets 140 so that the buffer gas is exhausted outside the chamber 105.

Hydrogen gas has low absorption of the EUV radiation. Hydrogen gas reaching to the coating surface of the LPP collector 110 reacts chemically with a metal of the target droplet 116, thus forming a hydride, e.g., metal hydride. When Sn is used as the target droplet 116, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the Sn debris and $SnH_4$ from entering the exposure tool 300 and the excitation laser source apparatus 200. To trap the Sn, $SnH_4$ or other debris, one or more debris collection mechanisms or devices, such as vanes 150, are employed in the chamber 105. In various embodiments, a controller 500 controls the EUV lithography system 10 and/or one or more of its components shown in and described above with respect to FIG. 1A.

Figure 1B:
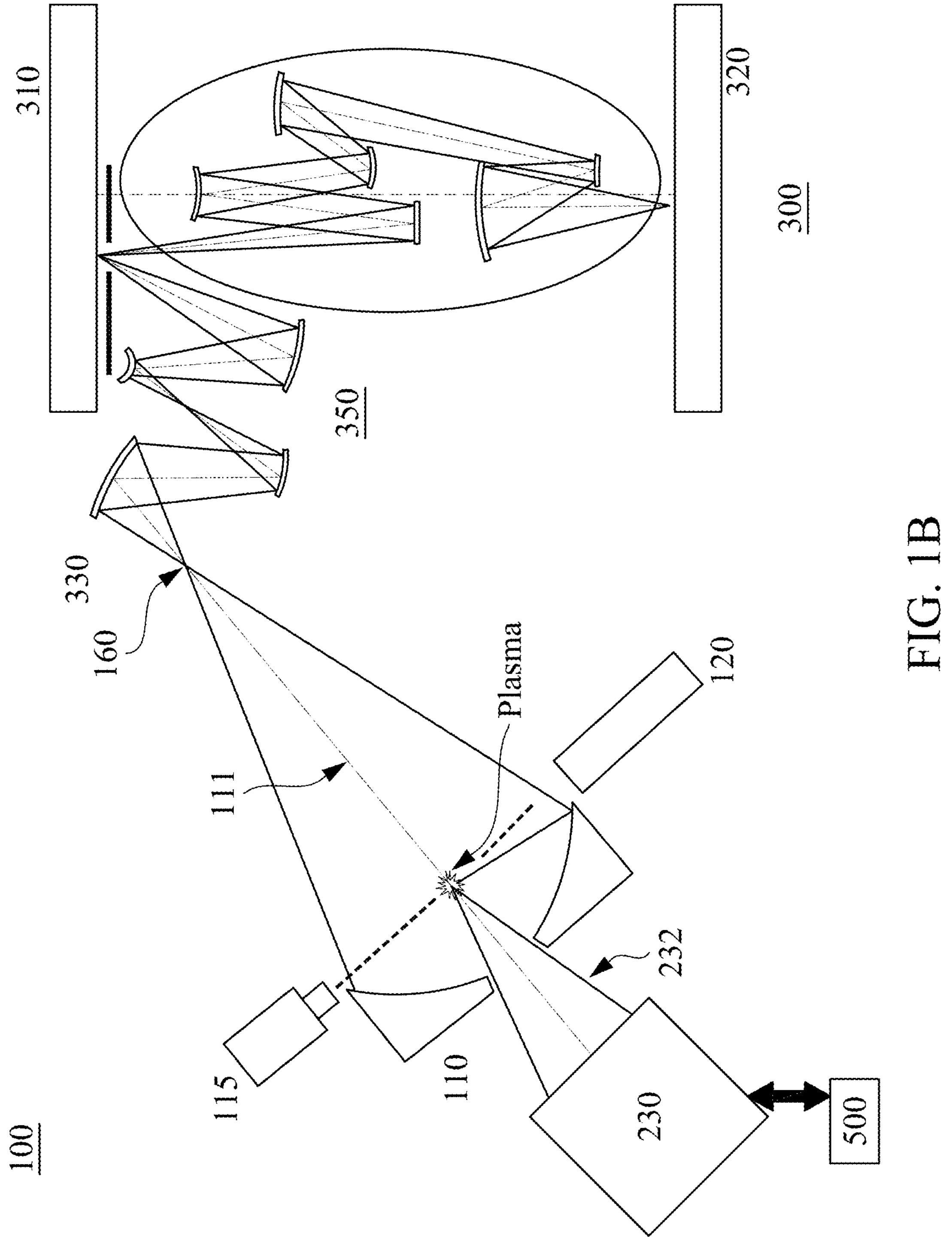
FIG. 1B and FIG. 1C are diagrams of laser and optics components in accordance with some embodiments.

As shown in FIG. 1B, the exposure tool 300 (sometimes referred to herein as the "scanner side" in reference to it, or one or more of its relevant parts) includes various reflective optic components, such as convex/concave/flat mirrors, a mask holding mechanism 310 including a mask stage (i.e., a reticle stage), and wafer holding mechanism 320 (i.e., a wafer stage). In various embodiments, the intermediate focus 160 is disposed at a junction point or intersection of the source side and the scanner side. The EUV radiation is generated by the EUV radiation source apparatus 100, propagates along the optical axis 111 and is focused at intermediate focus 160 in various embodiments. In various embodiments, the EUV radiation is then guided by the reflective optical components 305 onto a mask (not shown) secured on the reticle stage 310, also referenced as a "mask stage" herein. In some embodiments, the distance from the intermediate focus 160 to the reticle stage 310 disposed in the scanner side is approximately 2 meters. In some embodiments, the mask size is approximately 152 millimeters (mm) by 152 mm. In some embodiments, the reticle stage 310 includes an electrostatic chuck, or 'e-chuck,' (not shown) to secure the mask. The EUV light patterned by the mask is used to process a wafer supported on wafer stage 320. Because gas molecules absorb EUV light, the chambers and areas of the lithography system 10 used for EUV lithography patterning are maintained in a near-vacuum or a low-pressure environment to avoid EUV intensity loss. In various embodiments, the controller 500 controls one or more of the components of the EUV lithography system 10 as shown in and described with respect to FIG. 1B.

Figure 1C:
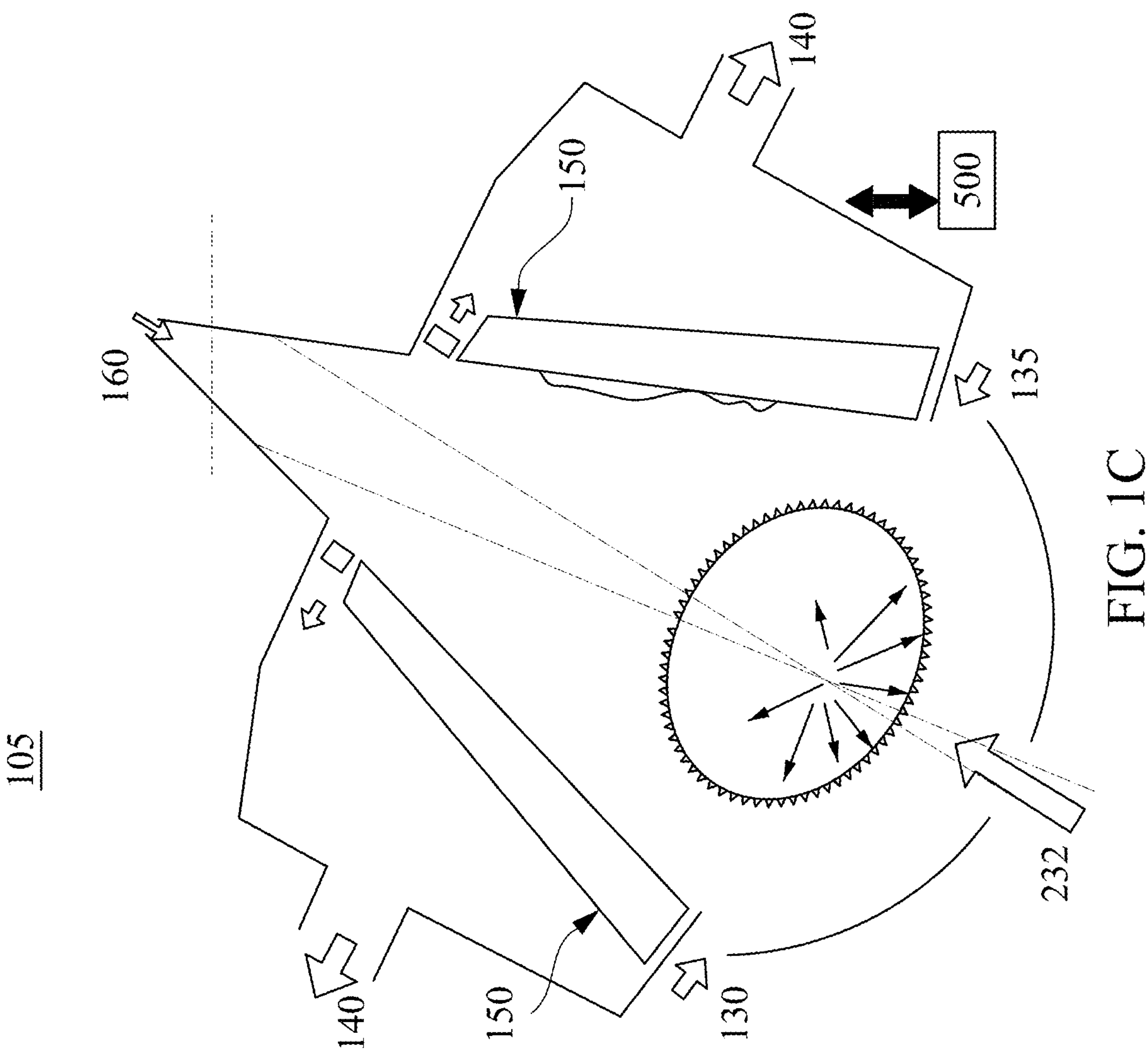

FIG. 1C shows further detail of the chamber 105 of the EUV radiation source apparatus 100, in which the relation of the LPP collector 110, the buffer gas supply 130, the second buffer gas supply 135, the gas outlet ports 140 and the intermediate focus 160 are illustrated. The main pulse 232 of the laser light is directed through an aperture in the LPP collector 110 to the excitation zone 106 where it irradiates a target plume to form an LPP. The LPP emits EUV light that is then collected by the LPP collector 110 and directed through the intermediate focus 160 toward the exposure tool 300 for use in patterning a wafer as described previously. In various embodiments, the controller 500 controls one or more of the components of the EUV lithography system 10 as shown in and described with respect to FIG. 1C.

In various embodiments of the EUV lithography system 10, pressure in the source side is higher than pressure in the scanner side. This is because the source side uses hydrogen gas ($H_2$) to force the removal of airborne Sn or other debris therefrom, while the scanner side is maintained in near-vacuum in order to avoid diminishing strength of the EUV light (that would be absorbed by airborne molecules) or interfering with the semiconductor manufacturing operations performed therein. As EUV light or radiation is generated, at least 50% of the mass of each tin droplet 116 used to form the LPP does not vaporize, but instead becomes debris in the form of numerous tin nanoparticles ranging in diameter from 30 nm to 100 nm.

Sn fall-on contamination control is an important issue for high volume manufacturing (HVM) of the EUV lithography system 10. During its lifetime, around 30 kilograms (kg) of Sn droplets interact with the high-power $CO_2$ laser for generating Sn plasma and 13.5 nm EUV radiation. In order to reduce such fall-on contamination of the source side, in various embodiments the walls of the chamber 105 are heated by one or more heaters (not shown) disposed around the source side that heat the walls to a temperature that will melt incident tin debris. This molten tin debris then follows the wall of vessel and, in various embodiments, is ultimately deposited in a debris container, such as the aforementioned droplet catcher 120. According to embodiments of the present disclosure, such debris is instead collected by additional containers that are constructed and operate similar to the droplet catcher 120 (e.g., a second debris collector). In various embodiments, the droplets and debris recovered by droplet catcher 120 and similarly disposed debris containers is collected, separately decontaminated and then reused by the EUV lithography system 10 to generate tin droplets 116.

In various embodiments, in order to further collect and remove this nanoparticle debris, a number of vanes 150 are arranged surrounding the optical axis 111 of the source side. In various embodiments, the vanes 150 are made of a suitable material, such as stainless steel, copper (Cu), Aluminum (Al), or ceramics. In certain embodiments, the vanes 150 are made of stainless steel. In various embodiments, the surfaces of vanes 150 are coated with a catalytic layer including ruthenium (Ru), tin (Sn), tin oxide, titanium oxide, or any combination thereof. In some embodiments where Ru is used, the Ru-coated surfaces of the vanes 150 reduce airborne tin debris by trapping Sn droplets thereon.

By applying a catalytic layer made of, for example, Ru, on the surface of vanes 150, it is possible to reduce airborne $SnH_4$ vapor to metal Sn, and then to collect such metal debris directly, thus preventing contamination of the collector 110. This serves to extend the life of the collector 110 and, in turn, the operation time of the EUV lithography system 10. In various embodiments where the target droplet 116 used to generate EUV radiation is made of a different material than Sn, the same or a different catalytic material may be used as the catalytic material layer.

Figure 1D:
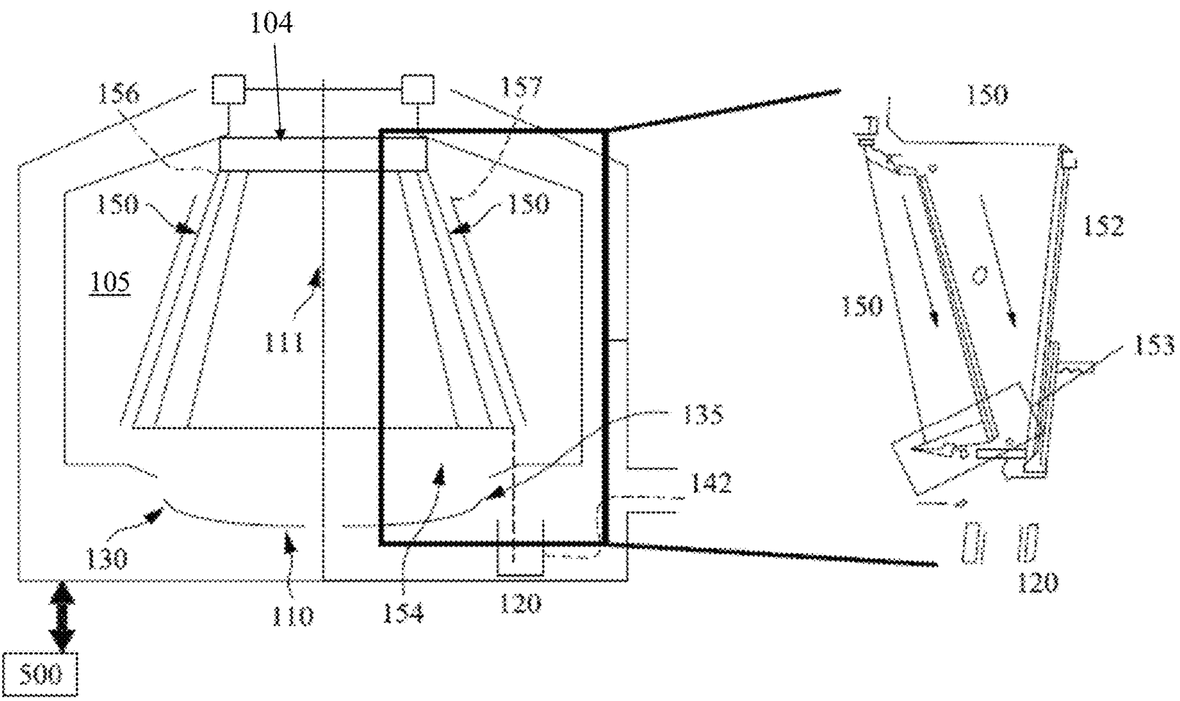
FIG. 1D is a diagram of a source vessel with debris collection vanes in accordance with some embodiments.

FIG. 1D is a diagram of the chamber 105 of the source side with a plurality of debris collection vanes 150 in accordance with various embodiments. The chamber 105 includes the vanes 150 in relation to the collector 110, the buffer gas supply 130, and the second buffer gas supply 135. In various embodiments, the plurality of vanes 150 project radially inwardly from a frustoconical support frame within the chamber 105. In some embodiments, the support frame 104 is driven to rotate by a drive unit (not shown) including one or more motors, one or more belts and/or one or more gears, or any other useful rotating mechanism. In various embodiments, the vanes 150 are thin and elongated plates. In some embodiments, the vanes 150 have a triangular, trapezoid or trapezium shape in plan view. In some embodiments, the vanes 150 are aligned so that their longitudinal axes are parallel to the optical axis 111, thereby presenting the smallest possible cross-sectional area to the EUV radiation generated in the source side. In some embodiments, the longitudinal axes of the vanes surround the optical axis. In other embodiments, the longitudinal axes of the vanes are not parallel to the optical axis. In some embodiments, the vanes 150 project towards the optical axis 111, but do not extend as far as the optical axis 111. In some embodiments, a central core of the vane 150 is empty. In various embodiments, the vanes 150 are heated by a heater 154, such as a heating wire 156, which is powered by a power source. In some embodiments, the vanes 150 are heated such that their surface temperatures are between 100 degrees Celsius (C) and 400 degrees C. during operation of the source side.

As set forth above, tin vapor or tin debris is guided to and collected by the vanes 150. As a result, the vanes 150 serve to prevent such tin debris from falling onto the components of the source side, such as the collector 110, and collected debris is thus, also prevented from travelling further downstream through the EUV lithography system 10. In various embodiments, the vanes 150 are configured to guide debris smoothly with practical thermal control, which temperature may be controlled with a warm cycle and a hot cycle in some embodiments. In such embodiments, the hot cycle is intended to melt tin and avoid bubble defect bursts at tin spitting temperatures. Accordingly, in some embodiments where the target droplets 116 are Sn, the temperature of the hot cycle is in the range of about 232 degrees C. (i.e., the melting temperature of tin) to about 350 degrees C. The temperature range at which undesirable tin "spitting" occurs is dependent upon internal gas components and chamber pressure, typically in the range of several millibars. In various embodiments, the warm cycle is activated to then let tin debris slide and roll along the surfaces of the vanes 150 so that it is guided to droplet catcher(s) 120 in order to avoid spitting. Accordingly, in various embodiments, the warm cycle temperature is in the range from about 100 degrees C. to about 232 degrees C. Consequently, the range of surface temperatures of the vanes 150 will vary from about 100 degrees C. to about 350 degrees C. in the warm and hot cycles. In various embodiments, melting tin debris trapped by the vanes 150 flow into a gutter 154, which in various embodiments is heated, such as described with respect to the warm or hot cycles. Finally, the melted tin debris flows through the gutter 155 to the droplet catcher 120 for waste storage, waste removal or reuse, in various embodiments. In some embodiments, a second heating wire 142 is provided to warm the debris catcher 120 and/or its contents for ease of storage, removal and/or reuse of the collected debris. In embodiments where the EUV light is projected upwardly along the optical axis 111 within the EUV lithography system 10, the melted tin moves along the surfaces of the chamber wall, the vanes 150 and through the gutter 155 due to the force of gravity.

As further displayed in FIG. 1D, the vane 150 further has an inner side 151 disposed towards the interior of the chamber 105 and an outer side 152 disposed towards the walls of the chamber 105 in various embodiments. In some embodiments, the inner side 151 is heated by the heater 154 with warm and hot cycles as described above.

In some embodiments, the source side 100 further includes a cooling channel 157 disposed on the support frame and adjacent to or in contact with the vanes 150. In some embodiments, the cooling channel 157 may surround the chamber 105. In some embodiments, the cooling channel 157 has a cooling fluid therein in order to cool the vanes 150. In some embodiments, the cooling fluid cools the outer portion 152 of the vanes 150. In some embodiments, the cooling channel 157 may be configured to cool gas flowing through the vanes 150 and/or to condense debris and debris vapors that may undesirably absorb EUV radiation, e.g. tin vapor when tin is used as the target droplets 116. In some embodiments, the cooling fluid may cool the vanes 150 through heat radiation. That is, the cooling channel 157 and the cooling fluid are spaced apart from the vanes 150. In other embodiments, the cooling fluid may further cool the vanes 150 using heat conduction when the cooling channel 157 is in direct contact with the vanes 150.

In various embodiments, residual nanoparticle debris is collected on both the inner side 151 and the outer side 152 of the vane 150. In various embodiments, a drip pin 153 is provided at the end of the vane 150 in order to allow melted debris to form droplets and thereafter be directed to the gutter 155 and the droplet catcher 120.

In various embodiments, the controller 500 controls one or more of the components of the EUV lithography system 10, such as the heater 154, heating wires 156 and the cooling channel 157 in order to maintain the vanes 150 at the desired temperatures, as shown in and described with respect to FIG. 1D above.

Figure 2A:
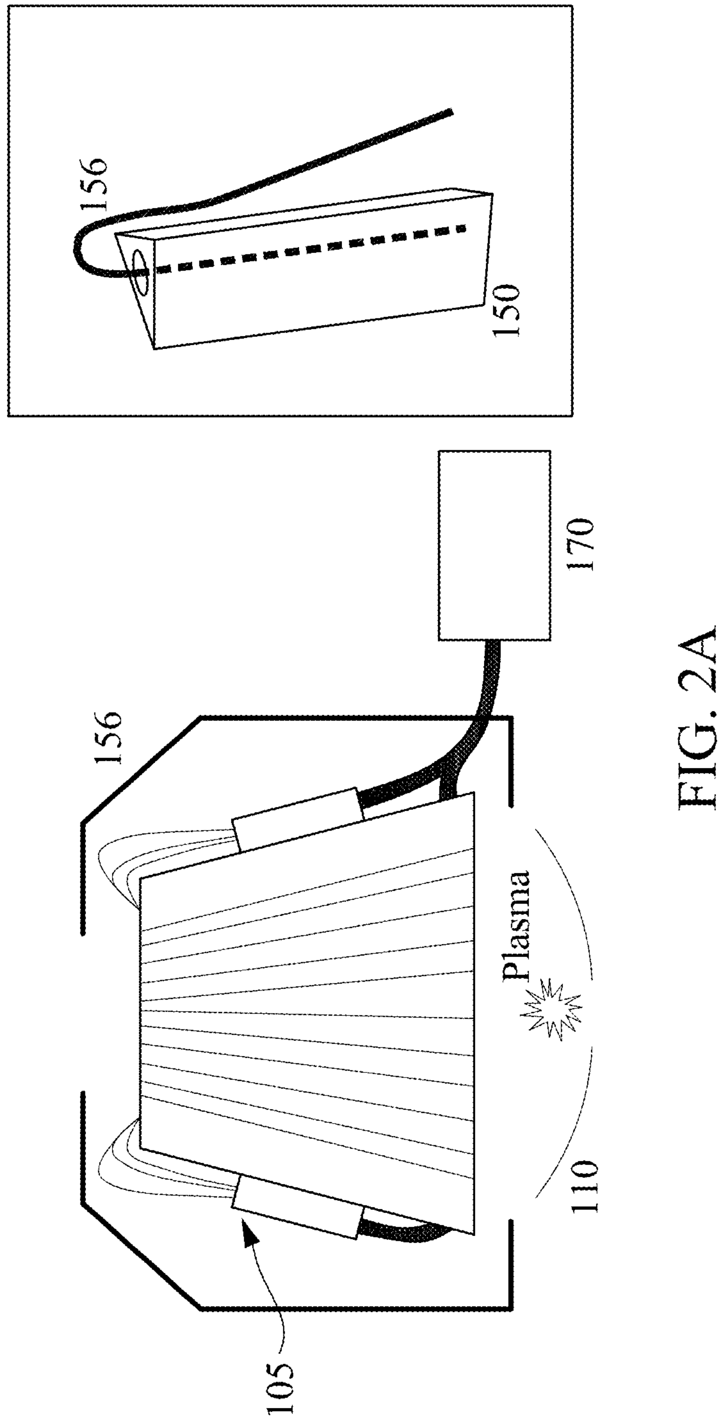
FIG. 2A is a diagram of a debris collection vane with a heating wire in accordance with some embodiments.

FIG. 2A is a detailed diagram of a debris collection mechanism such as the vane 150 with a heating wire 156 in accordance with some embodiments. In various embodiments, the vane 150 is solid. In some embodiments, the vane 150 is hollow. In various embodiments, the heating wire 156 is embedded within the vane 150 and is powered by an external power supply 170. In some embodiments, the leads for the heating wires 156 are disposed along a backside of the support frame holding the vanes 150.

Figure 2B:
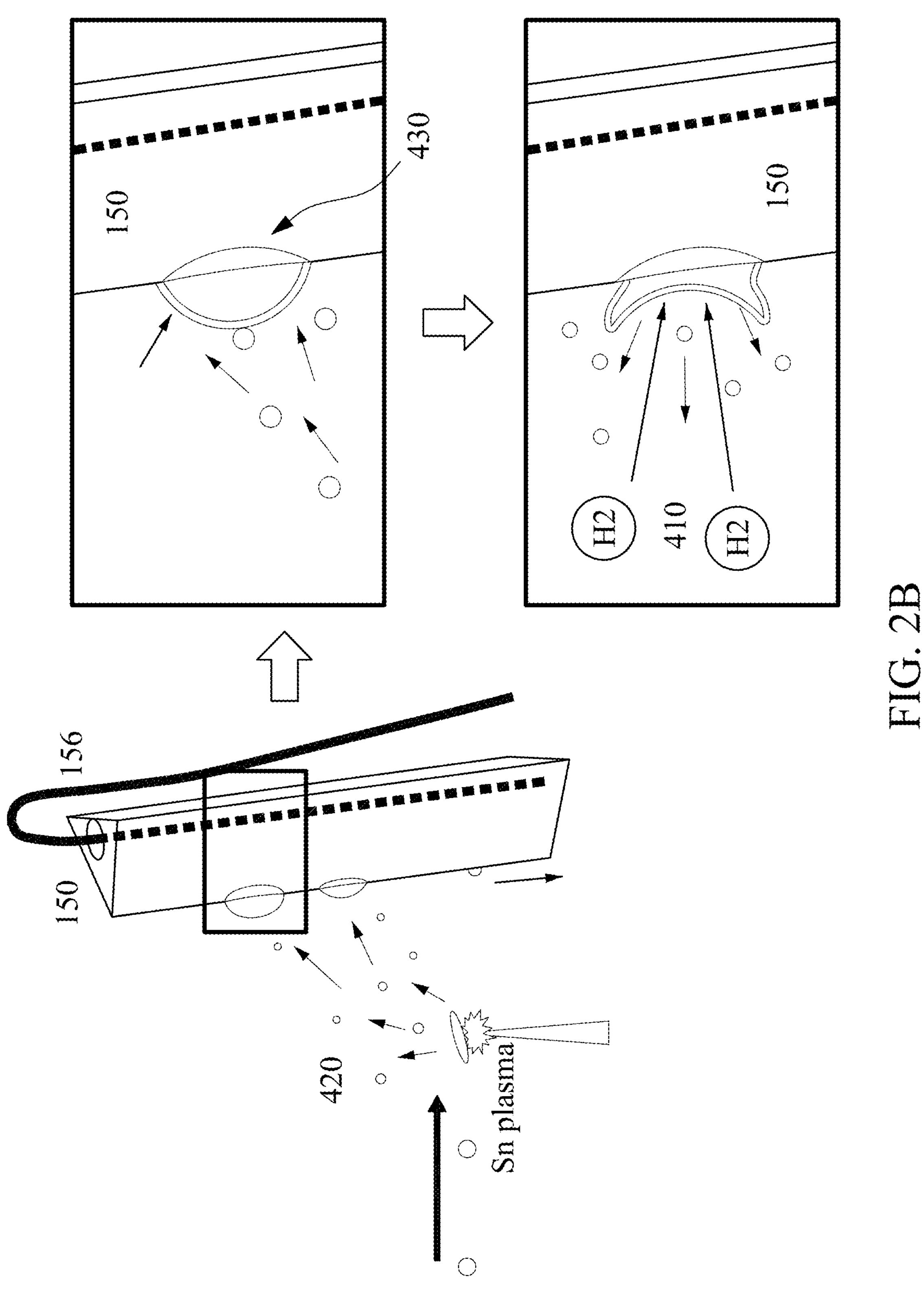
FIG. 2B is a diagram of metal debris accumulating on a debris collection vane with a heating wire in accordance with some embodiments.

FIG. 2B is a diagram of metal debris 420 accumulating on a debris collection vane 150 heated with an internal heating wire 156 in accordance with some embodiments. As depicted therein, metal debris 420, such as tin nanoparticles, are formed during the generation of LPP by the source side. The debris 420 accumulates of the surface coating of the vane 150 and drains towards and end thereof after being heated. In various embodiments, the use of internal heating wires 156 causes variations and unevenness in the surface temperature of the vane 150. In various embodiments, cold spots 430 form at various positions on the surface of the vane 150. This can cause clogging that prevents tin debris 420 from draining properly. Such clogging can occur on both the inner side 151 and outer side 152 of the tin vane. When the clogged portions are hit with additional airborne tin debris 420 or by molecules of the buffer gas, such as $H_2$ molecules 410, tin spitting also occurs do to temperature differentials of those materials. Tin clogging and spitting increases the potential for contamination of various components of the source side 100, which in turn adversely affects the operational lifetime of the source side components.

In the foregoing embodiments, the vanes 150 within the chamber 105 are heated by heating wires 156, which has the potential risk of Sn clogging and Sn fall-on contamination due to the uneven temperature distribution. Sn-debris will be melted on the vane 150 with buried heating wires 156 and drained to the droplet catcher 120. However, the uneven heating provided by the heating wires 156 induces cold spots that, in turn, cause clogging which increases Sn fall-on risk and shortens the useful lifetime of the source side 100.

To ameliorate this issue, microwave radiation is instead used to heat the vanes 150 uniformly by adjusting the electromagnetic field of an absorption material (e.g., SiC) attached to or coated on the vanes 150 in various embodiments. Using microwave heating efficiently reduces the formation of Sn clogging, even on the cooler backside of the vanes 150. In such embodiments, there is no need to provide a heater 154 and heating wires 156, thereby reducing material costs and maintenance. With more uniform heating and a stable temperature distribution, Sn debris 420 melts and drains smoothly, which reduces the Sn fall-on contamination, thereby further increasing the operational lifetime of the source side. In other embodiments, the microwave radiation is used in addition to the heating wires.

Figure 3A:
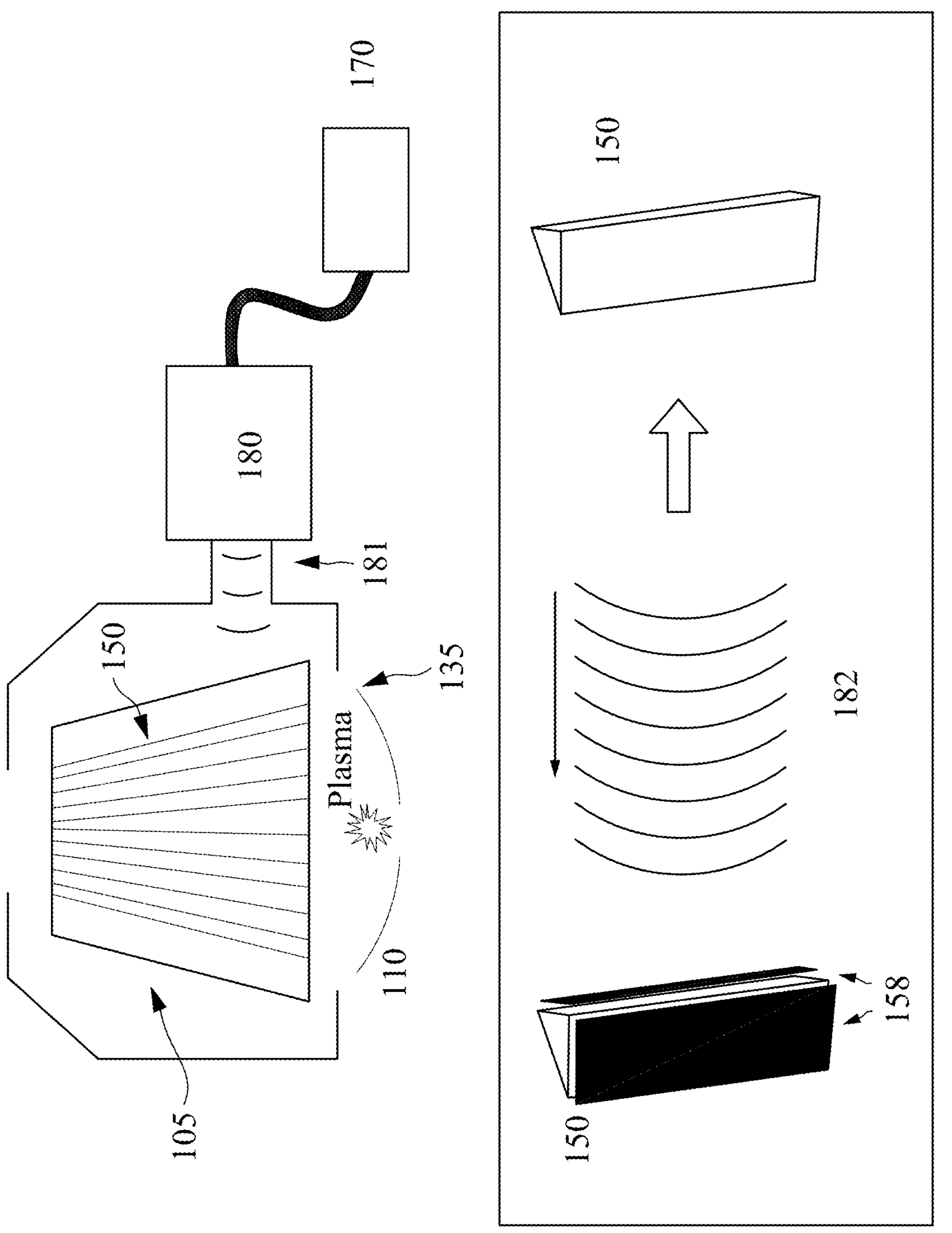
FIG. 3A is a diagram of a debris collection vane heated by microwaves in accordance with some embodiments.

FIG. 3A is a diagram of a debris collection vane 150 heated by microwaves 182 in accordance with some embodiments. In various embodiments, a microwave generator 180 is externally connected to the chamber 105 via a conduit 181. In various embodiments, the microwave generator 180 is a magnetron, a klystron or a solid-state microwave power generator (SSPG). In various embodiments, the microwave generator 180 generates microwaves 182 at a fixed frequency, such as 1.2 gigahertz (GHz) or 2.45 GHz. In various embodiments, the microwave generator 180 generates microwaves 182 at a variety or range of frequencies. In various embodiments, the microwave generator is powered by an external power supply 170. In various embodiments, the conduit 181 is a microwave waveguide. In various embodiments, microwaves 182 generated by the microwave generator 180 are introduced into the chamber 105 via the conduit 181 for uniformly heating the vanes 150 with microwave radiation, in place of a heater 154 or heating wires 156. In some embodiments, the vanes 150 are solid. In some embodiments, the vanes 150 are hollow. In various embodiments, any openings in the chamber 105 are reduced in size in accordance with a microwave cutoff frequency to prevent leakage of microwaves 182 external to the chamber 105. For example, where the microwave generator generates microwave radiation at 2.45 GHz, any openings should be on the order of 3 centimeters (cm) or less. In various embodiments, multiple microwave generators 180 are disposed around the support frame to provide further uniform heating. In various embodiments, the multiple microwave generators 180 are disposed equidistantly around the support frame holding the vanes 150 in order to promote uniform temperature heating. In various embodiments, the vanes 150 have an absorption material 158 disposed on their outer surface to absorb the microwave radiation and heat the surface of the vane 150. The uniform heating achieved in this manner reduces the formation of cold spots and concomitant clogging formation and tin spitting.

Figure 3B:
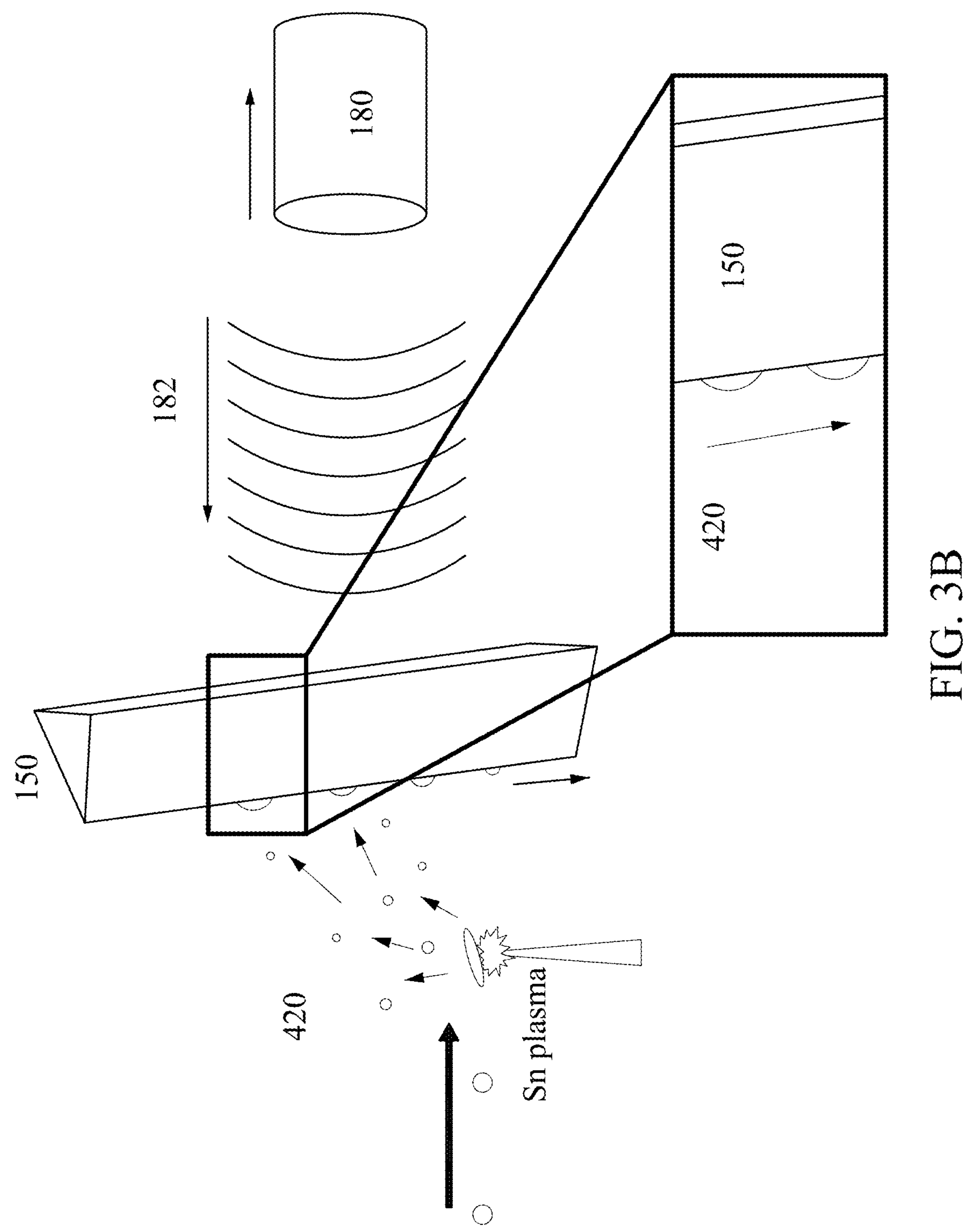
FIG. 3B is a diagram of metal debris accumulating on a debris collection vane heated by microwaves in accordance with some embodiments.

FIG. 3B is a diagram of metal debris 420 accumulating on a debris collection vane 150 heated by microwaves 182 in accordance with some embodiments. The uniform and stable heating associated with microwave radiation heating prevents excessive cold spot formation on the vanes 150. Residual tin nanoparticle debris 420 that settles on the surface of the vanes 150 are heated thereby to melting temperatures, flow smoothly down the vane 150 and are drained to the droplet catcher 120.

Figure 4A:
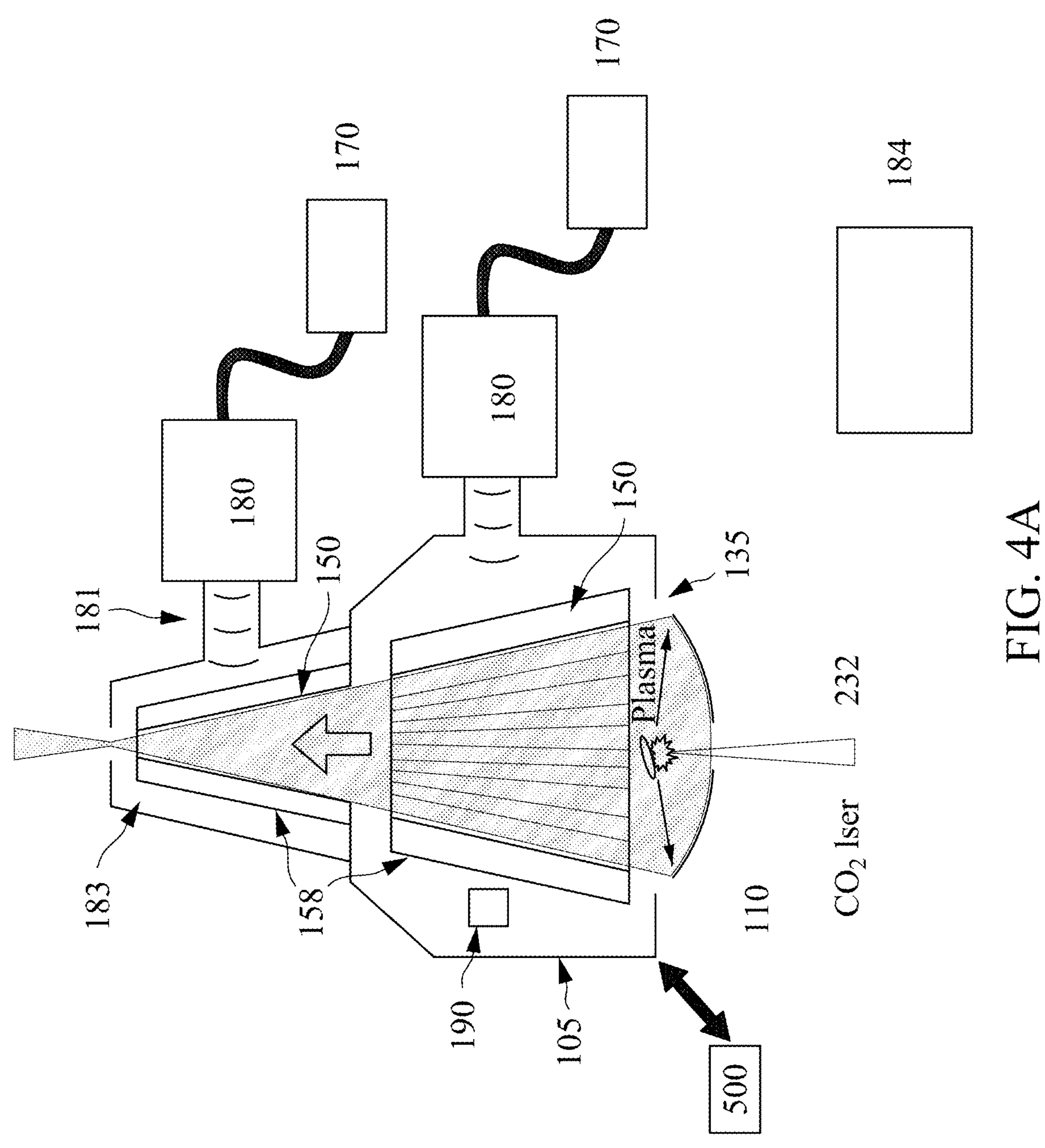
FIG. 4A is a diagram of debris collection vanes being externally heated by microwaves in accordance with some embodiments.

Microwave heating of the vanes 150 can be accomplished in two general manners, by heating the vanes 150 externally or internally. FIG. 4A is a diagram of debris collection vanes 150 being externally heated by microwaves 182 in accordance with some embodiments. In various embodiments, microwaves 182 are introduced into the chamber 105 by one or more microwave generators 180 via conduits 181. In such embodiments, the entirety of the interior of the chamber 105 constitutes a microwave occupied region 183. In various embodiments, the number of microwave generators 180 used will depend of the size of the chamber 105. In such embodiments, smaller chambers 105 will require fewer numbers of microwave generators 180. In various embodiments, an absorption material 158 is disposed substantially entirely along the surface of vanes 150 to absorb microwaves 182 in order to enhance uniform heating of the vanes 150. In various embodiments, a metallic mesh 184, or net, is disposed along at least a portion of the interior of the chamber 105 in order to protect against leakage of the microwaves 182. In various embodiments, the metallic mesh 184 has various openings that allow viewing there-through, but prevent microwave leakage by having maximum widths less than the cut-off frequency of the microwaves 182. In various embodiments, the openings of the metallic mesh 184 can be in a variety of shapes including diamonds, squares, circles, polygons and other regular or irregular geometric shapes. In various embodiments, the metallic mesh 184 is placed at one or more of the openings in the chamber 105 to prevent microwave leakage therefrom, such as at the first buffer gas supply 130, the second buffer gas supply 135, and the gas outlet(s) 140, without limitation. In other embodiments, such openings in the chamber 105 are themselves sized to be less than the microwave cut-off frequency so as to prevent leakage without the need for the metallic mesh 184.

As further shown in FIG. 4A, in various embodiments, the frustoconical support frame used to support and/or rotate the vanes 150 within the chamber 105 is modularized or sectionalized in order to simplify uniform temperature heating and more readily facilitate replacement of the vanes 150 when necessary (i.e., one section may be removed and replaced without disturbing the other sections). In such embodiments, two or more separate support frames having vanes 150 may be adjacently disposed within the chamber 105. In such embodiments, each support frame has at least one dedicated microwave generator for warming the vanes 150 thereof as shown.

In various embodiments, one or more temperature sensors 190 are provided to monitor the surface temperature of the vanes 150 during operation. In certain embodiments, the temperature sensor 190 may be disposed inside and/or outside the chamber 105 to monitor the temperature of the vanes 150. In various embodiments, a controller 500 monitors the temperature readings of the vanes 150 provided the temperature sensor 190 and responsively activates the microwave generator(s) 180 to provide or cease heating in accordance with the measured temperature. For example, during operation when a surface temperature of the vanes 150 is to be maintained between 300 and 400 degrees Celsius, the controller 500 may intermittently turn on or increase the power of one or more of the microwave generators 180 when the surface temperature of the vanes 150 approaches or falls below the lower temperature limit. Similarly, in such embodiments, the controller 500 may intermittently turn off or decrease the power of one or more of the microwave generators 180 when the surface temperature of the vanes 150 approaches or surpasses the upper temperature limit. In some embodiments, at least some of the microwave generators 180 are continuously activated during operation of the source side.

In various embodiments, a temperature sensor 190 is a contact temperature sensor that is disposed in the chamber 105 in contact with at least a portion of the vane 150 in order to determine its surface temperature. In some of these embodiments, the temperature sensor 190 is a thermocouple that is made from two dissimilar metals, which generate an electrical voltage in direct proportion with the change in temperature, and having an effective operating range between-200 and 1750° C. In some of these embodiments, the temperature sensor 190 is a resistance temperature detector (RTD), having a variable resistor that changes its electrical resistance in direct proportion to a change in the temperature in a precise, repeatable and nearly linear manner, and having an effective operating range between-200 and 600° C. In some of these embodiments, the temperature sensor 190 is a negative temperature coefficient (NTC) thermistor, which is a thermally sensitive resistor that exhibits a continuous, small, incremental change in resistance correlated to variations in temperature, and having an effective operating range between-50 and 250° C. Other useful types of contact temperature sensors are readily contemplated.

In alternate embodiments, the temperature sensor 190 is instead a non-contact temperature sensor, which may be disposed inside or outside the chamber 105 to monitor the surface temperature of the vanes 150. In such embodiments, the temperature sensor 190 may be one or more of the following sensor types without limitation: a radiation thermometer that gauges temperature based on the radiation released from the vane 150, a thermal imager, an optical pyrometer, and a fiber optic temperature sensor. Other useful types of non-contact temperature sensors are readily contemplated.

Figure 4B:
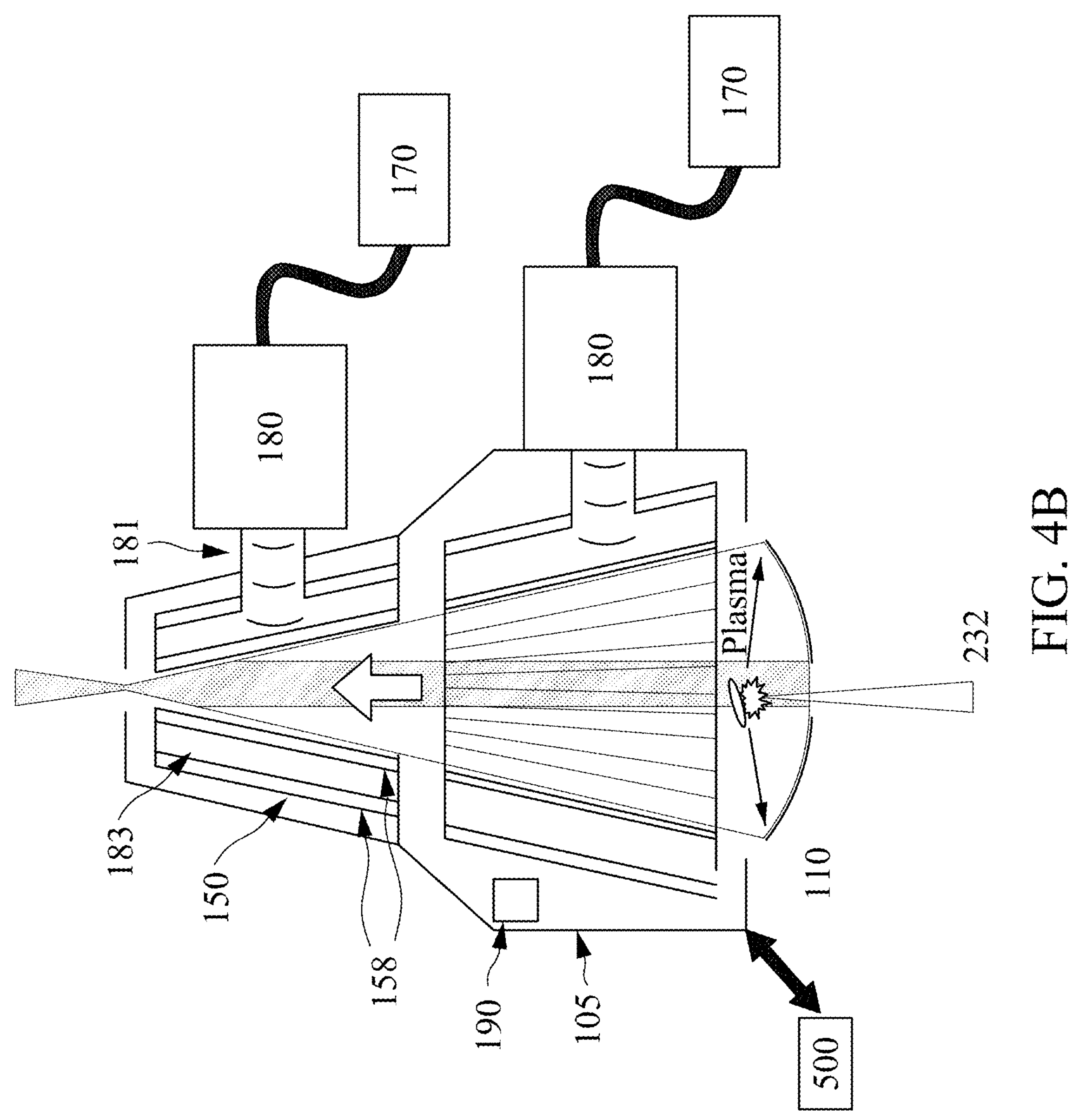
FIG. 4B is a diagram of debris collection vanes being internally heated by microwaves in accordance with some embodiments.

FIG. 4B is a diagram of debris collection vanes 150 being internally heated by microwaves 182 in accordance with some embodiments. In such embodiments, the vanes 150 are hollow. In such embodiments, the conduits 181 direct the microwaves 182 from the microwave generator 180 to the hollow interior of each vane 150 to heat the external surfaces of the vanes 150 from within. In such embodiments, an absorption material 158 (e.g., SiC) is disposed internally within the hollow of each vane 150 along substantially the entire extent of each internal surface thereof in order to promote uniform heating by the microwaves 182. In such embodiments, the microwave occupied region 183 is disposed entirely within the vanes 150, instead of being the entirety of the chamber 105 as previously described. In such embodiments, there is no need to reduce chamber opening sizes or to provide the metallic mesh 184 in order to prevent microwave leakage since the microwave 182 are constrained to the internal portions of the vanes 150 exclusively. In various embodiments, the temperature sensor 190 and the controller 500 are used to monitor and maintain the surface temperature of vanes 150 as heretofore described.

Figures 5A, 5B:
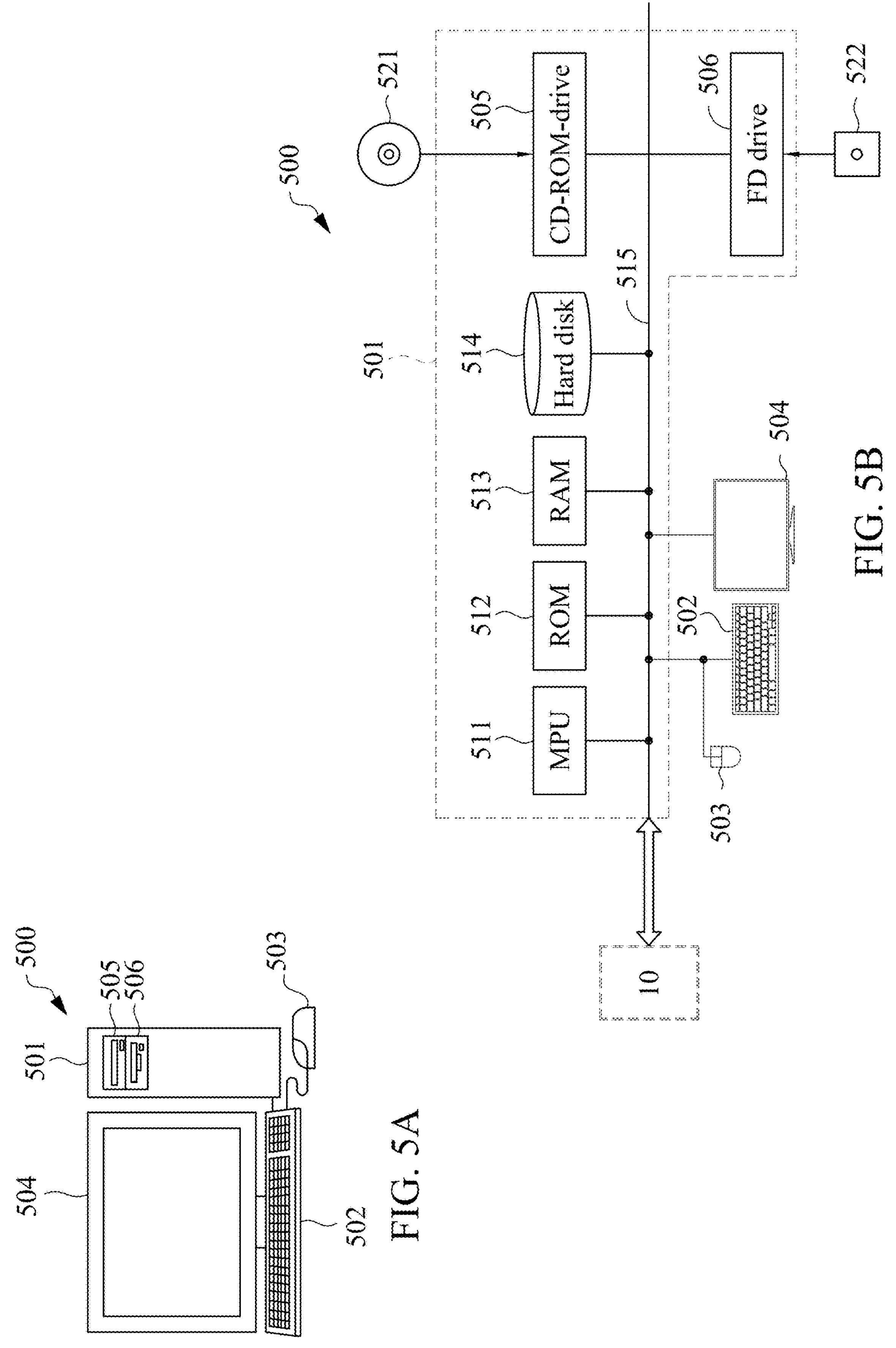
FIG. 5A and FIG. 5B are diagrams of a controller in accordance with some embodiments.

FIG. 5A and FIG. 5B illustrate a computer system 500, or controller, for controlling the system 10 and its components in accordance with various embodiments of the present disclosure. FIG. 5A is a schematic view of a computer system 500 that controls the source side 100 in, inter alia, FIG. 1A and/or one or more of its various components. In some embodiments, the computer system 500 is programmed to initiate a process for monitoring and maintaining temperature levels of the vanes 150 via the temperature sensor 190. In some embodiments, one or more of the microwave generators 180 are controlled continuously and/or intermittently in response to the measured temperature. As shown in FIG. 5A, the computer system 500 is provided with a computer 501 including an optical disk read only memory (e.g., CD-ROM or DVD-ROM) drive 505 and a magnetic disk drive 506, as well as a keyboard 502, a mouse 503 (or other similar input device), and a monitor 504 (or other output device), in various embodiments.

FIG. 5B is a diagram showing an internal configuration of the computer system 500, according to various embodiments. In FIG. 5B, the computer 501 is provided with, in addition to the optical disk drive 505 and the magnetic disk drive 506, one or more processors 511, such as a microprocessor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that in some embodiments the computer 501 includes a network card (not shown) for providing a connection to a computer network such as a local area network (LAN), wide area network (WAN) or any other useful computer network for communicating data used by the computer system 500 and the system 10. In various embodiments, the controller 500 communicates via wireless or hardwired connection to the system 10 and its components.

In various embodiments, the program for causing the controller 500 to execute the processes for controlling the system 10 of FIG. 1A, and components thereof and/or to execute the process for the method of manufacturing a semiconductor device according to the embodiments disclosed herein are stored in an optical disk 521 or a magnetic disk 522, which is inserted into the optical disk drive 505 or the magnetic disk drive 506, and transmitted to the hard disk 514. Alternatively, the program is transmitted via a network (not shown) to the computer system 500 and stored in the hard disk 514. At the time of execution, the program is loaded into the RAM 513. The program is loaded from the optical disk 521 or the magnetic disk 522, or directly from a network in various embodiments.

The stored programs do not necessarily have to include, for example, an operating system (OS) or a third party program to cause the computer 501 to execute the methods disclosed herein. The program may only include a command portion to call an appropriate function (module) in a controlled mode and obtain desired results in some embodiments. In various embodiments described herein, the controller 500 is in communication with the EUV lithography system 10 to control various functions thereof.

In various embodiments, the controller 500 is configured to provide control data to one or more system components and receive process and/or status data from those system components. For example, the controller 500 comprises a microprocessor, a memory (e.g., volatile or non-volatile memory), and a digital I/O port capable of generating control voltages sufficient to communicate and activate inputs to the processing system 100, as well as monitor outputs from the system 10. In addition, a program stored in the memory is utilized to control the aforementioned components of the lithography system 10 according to a process recipe. Furthermore, the controller 500 is configured to analyze the process and/or status data, to compare the process and/or status data with target process and/or status data, and to use the comparison to change a process and/or control a system component in various embodiments. In addition, the controller 500 is configured to analyze the process and/or status data, to compare the process and/or status data with historical process and/or status data, and to use the comparison to predict, prevent, and/or declare a condition, a fault or an alarm in various embodiments.

Figure 6:
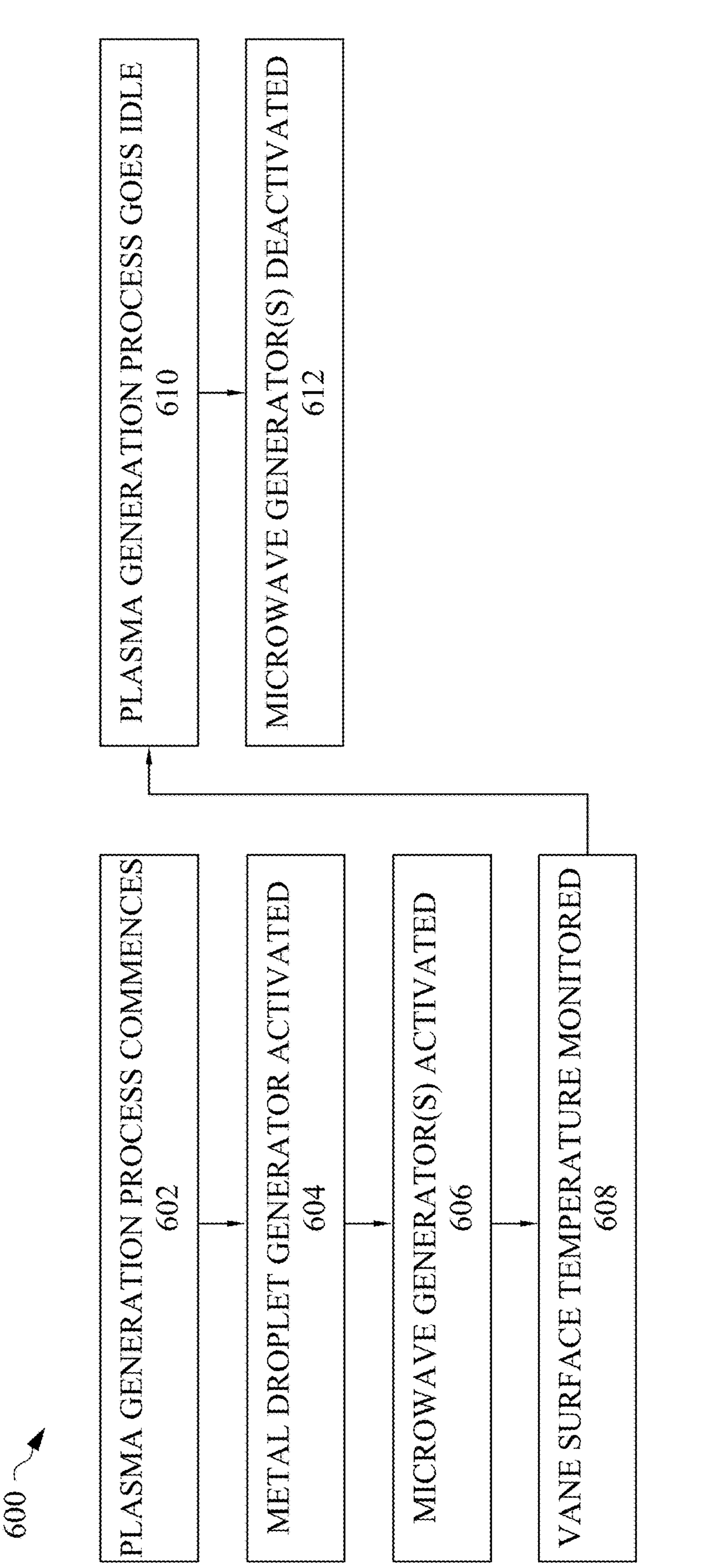
FIG. 6 is a flowchart of a temperature monitoring and maintenance process in accordance with some embodiments.

FIG. 6 is a flowchart of a process 600 for monitoring and maintaining temperature levels of the vanes 150 in accordance with some embodiments, which, in various embodiments, is performed by the controller 500. The process 600 commences with the start of plasma generation operations performed by the source side 100 (operation 602) when the droplet generator 115 is activated (operation 604). The metal droplets produce nanoparticle debris 420 as previously described, some of which progressively accumulates on the exterior surfaces of the vanes 150. In order to achieve uniform temperature across the surface of the vanes 150, the microwave generator(s) 180 are activated (operation 606) to direct microwave radiation to one or more of the interior of the chamber 105 or the interior of the vanes 150 themselves in various embodiments. The surface temperature of the vanes 150 are monitored (operation 608) by one or more contact or non-contact temperature sensors 190 that may be disposed internally and/or externally to the chamber 105 in various embodiments. The controller 500 monitors the temperature readings from the temperature sensors 190, and responsively controls the microwave generators 180, either continuously or intermittently, in order to maintain the desired temperature range in various embodiments. When the plasma generation process goes idle (operation 610) the controller 500 deactivates the microwave generator(s) 180 (operation 612) in various embodiments, after which the process 600 ends. The order of operations of the process 600 may vary in some embodiments.

According to the foregoing descriptions, uniform heating of vane surfaces allows for smooth debris drainage by reducing clogging, which in turn reduces fall-on debris contamination of various components and the walls of the source side 100. In embodiments where microwave radiation is employed to heat the vane surfaces, heating wire bundles are not needed inside the plasma chamber, which simplifies the system 10 and reduces hardware maintenance, such as from thread aging. In some embodiments, modularized vane support frames with a connected or dedicated microwave generator provides stable and uniform heating performance, while allowing damaged vanes to be readily swapped after wear. In various embodiments, the use of microwave radiation is less energy intensive than embodiments that employ heating by heating wire, and are useful in plasma chambers of varying sizes, from small to large.

According to various embodiments, an extreme ultra violet (EUV) lithography apparatus comprises a plasma chamber; a vane configured to collect debris generated in the plasma chamber; and a microwave generator configured to heat the vane with microwave radiation. In some embodiments, the microwave generator is at least one of a klystron, a magnetron and a solid-state microwave power generator (SSPG). In some embodiments, a temperature sensor is provided to monitor a surface temperature of the vane. In some embodiments, the temperature sensor is disposed within the plasma chamber. In some embodiments, the temperature sensor is a contact temperature sensor comprising at least one of: a thermocouple, a resistance temperature detector, a thermistor and a semiconductor temperature sensor. In some embodiments, the temperature sensor is disposed outside plasma chamber. In some embodiments, the temperature sensor is a non-contact temperature sensor comprising at least one of: a thermometer, a thermal imager, an optical pyrometer and a fiber optic temperature sensor. In some embodiments, a controller monitors the temperature of the vane with the temperature sensor and activates the microwave generator in accordance with the temperature. In some embodiments, a conduit directs microwaves from the microwave generator into the plasma chamber. In some embodiments, the vane is metallic and an exterior of the vane is coated with an absorption material for absorbing the microwaves from the microwave generator. In some embodiments, a conduit directs the microwaves to an interior of the vane. In some embodiments, a plurality of vanes are provided and aligned so that their longitudinal axes surround an optical axis of the plasma chamber. In some embodiments, a container collects debris from the vane. In some embodiments, a metal mesh shields an opening of the plasma chamber to prevent leakage of the microwaves.

According to various embodiments, an extreme ultra violet (EUV) lithography apparatus includes a chamber for generating EUV light. In various embodiments, the chamber has an optical axis in a direction towards a reticle stage. In various embodiments, a plurality of vanes are disposed on an inner surface of the chamber surrounding the optical axis. In various embodiments, a microwave generator generates microwaves to heat the plurality of vanes. In various embodiments, a conduit directs the microwaves to the interior of the plurality of vanes. In some embodiments, an interior surface of at least one of the vanes is coated with an absorption material configured to absorb the microwaves from the microwave generator and heating the external surface of the vane. In some embodiments, the vanes are supported on a support frame that is removable from the chamber.

According to various embodiments, an extreme ultra violet (EUV) lithography method comprises (i) activating a droplet generator and a laser generator configured to produce a plasma and EUV light within a source vessel; (ii) monitoring a surface temperature of a vane disposed within the source vessel for collecting debris from the plasma; and (iii) activating a microwave generator for heating the vane to a temperature sufficient to melt the debris. In some embodiments, the surface temperature of the vane is maintained substantially between 150 degrees Celsius and 400 degrees Celsius. In some embodiments, the surface temperature is maintained by at least one of: continuously activating the microwave generator, intermittently activating the microwave generator, and adjusting a power level of the microwave generator in response to the surface temperature.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultra violet (EUV) lithography apparatus, comprising a chamber for generating EUV light;

an optical axis in a direction towards a reticle stage;

a plurality of vanes disposed on an inner surface of the chamber surrounding the optical axis; and a microwave generator configured to generate microwaves to heat the plurality of vanes, wherein the microwave generator is at least one of a klystron, a magnetron and a solid-state microwave power generator (SSPG).

2. The apparatus of claim 1, further comprising a conduit configured to direct the microwaves to the interior of the plurality of vanes.

3. The apparatus of claim 2, wherein the conduit is a microwave waveguide.

4. The apparatus of claim 1, wherein an interior surface of at least one of the vanes is coated with an absorption material configured to absorb the microwaves from the microwave generator and heating an external surface of the vane.

5. The apparatus of claim 4, wherein the absorption material is comprised of SiC.

6. The apparatus of claim 1, wherein the vanes are supported on a support frame that is removable from the chamber.

7. The apparatus of claim 1, wherein the EUV light has a wavelength of from 1 nanometer to 100 nanometers.

8. An extreme ultra violet (EUV) lithography apparatus, comprising a chamber for generating EUV light;

an optical axis in a direction towards a reticle stage;

an excitation laser source for generating laser light;

a droplet generator for generating a plurality of target droplets;

a plurality of vanes disposed on an inner surface of the chamber surrounding the optical axis; and a microwave generator configured to generate microwaves to heat the plurality of vanes, wherein the microwave generator is at least one of a klystron, a magnetron and a solid-state microwave power generator (SSPG).

9. The apparatus of claim 8, wherein the excitation laser source comprises a laser generator, laser guide optics, and a focusing apparatus.

10. The apparatus of claim 9, wherein the laser generator includes at least one of a carbon dioxide laser source or a neodymium-doped yttrium aluminum garnet (NdYAG) laser source.

11. The apparatus of claim 8, further comprising a laser-produced plasma (LPP) collector for collecting the EUV light.

12. The apparatus of claim 11, wherein the LPP collector comprises one or more mirrors, each having a reflection surface for reflecting and focusing EUV light.

13. The apparatus of claim 12, wherein the mirrors include a coating material on the surface thereof comprised of at least one of molybdenum/silicon (Mo/Si) and ruthenium (Ru).

14. The apparatus of claim 8, further comprising a droplet catcher arranged opposite the droplet generator for collecting target droplets.

15. The apparatus of claim 8, wherein the excitation laser source further includes a pre-heat laser for generating a pre-pulse for pre-heating the target droplets.

16. An extreme ultra violet (EUV) lithography method, comprising:

activating a droplet generator and a laser generator configured to produce a plasma and EUV light within a chamber;

generating EUV light in the chamber having an optical axis in a direction towards a reticle stage and a plurality of vanes disposed on an inner surface of the chamber surrounding the optical axis;

generating microwaves to heat the plurality of vanes using a microwave generator; and directing the microwaves to an interior of the plurality of vanes using a conduit.

17. The method of claim 16, further comprising maintaining a temperature of the inner surface of the chamber by at least one of: continuously activating the microwave generator, intermittently activating the microwave generator, and adjusting a power level of the microwave generator in response to the surface temperature.

18. The method of claim 16, wherein the microwave generator is at least one of a klystron, a magnetron and a solid-state microwave power generator (SSPG).

19. The method of claim 16, wherein an interior surface of at least one of the vanes is coated with an absorption material configured to absorb the microwaves from the microwave generator and heat the external surface of the vane.

20. The method of claim 16, wherein the vanes are supported on a support frame that is removable from the chamber.

* * * * *